United States Patent
Schuyler et al.

(10) Patent No.: US 6,307,970 B1
(45) Date of Patent: Oct. 23, 2001

(54) SEARCH SYSTEM FOR USE IN COMPRESSION

(75) Inventors: Marc P. Schuyler; Susie J. Wee, both of Mountain View, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/542,179

(22) Filed: Apr. 4, 2000

Related U.S. Application Data

(63) Continuation of application No. 09/191,727, filed on Nov. 12, 1998, now Pat. No. 6,081,209.

(51) Int. Cl.[7] ................................................ G06K 9/36
(52) U.S. Cl. ........................ 382/236; 382/238; 382/239
(58) Field of Search ................................... 382/236, 238, 382/239, 232; 348/452, 699; 709/247

(56) References Cited

U.S. PATENT DOCUMENTS

| | | | | |
|---|---|---|---|---|
| 5,025,495 | * | 6/1991 | Avis | 358/140 |
| 5,661,524 | * | 8/1997 | Murdock et al. | 348/416 |
| 5,691,775 | * | 11/1997 | Astle | 348/416 |
| 5,793,985 | * | 8/1998 | Natarajan et al. | 395/200.77 |
| 6,014,181 | * | 1/2000 | Sun | 348/699 |

OTHER PUBLICATIONS

Chalidabhongse et al., "Fast Motion Vector Estimation Using Multiresolution–Spatio–Temporal Correlations", IEEE Transctions on Circuits and Systems for Video Technology, vol. 7, No. 3, PP. 477–488, Jun. 1997.*

* cited by examiner

Primary Examiner—Jose L. Couso
Assistant Examiner—Anh Hong Do
(74) Attorney, Agent, or Firm—Marc P. Schuyler

(57) ABSTRACT

This disclosure provides a block-based compression system which uses a variable size search window, to thereby substantially reduce the time required for compression. In a MPEG-2 system, square tiles are processed left to right in rows, beginning at the top of a frame and finishing at the bottom. The absolute value of pixel differences for already-processed "northwest," "north," "northeast" and "west" neighbor tiles are separately summed and compared to a threshold. If any of the sums exceeds the threshold or if any of the neighbor tiles are unavailable (e.g., the tile under consideration is in the top row or the left-most column), then a maximum size search window is used to determine the tile's "closest match" in a prior image frame and the associated motion vector. If none of the exceed the threshold, then a relatively smaller size search window is used. The size of the smaller window is selected in dependence upon the motion vectors for the neighbor tiles, e.g., if the neighbor tiles have similar motion vectors and small residuals, the search for the "closest match" is performed in a relatively small area.

7 Claims, 3 Drawing Sheets

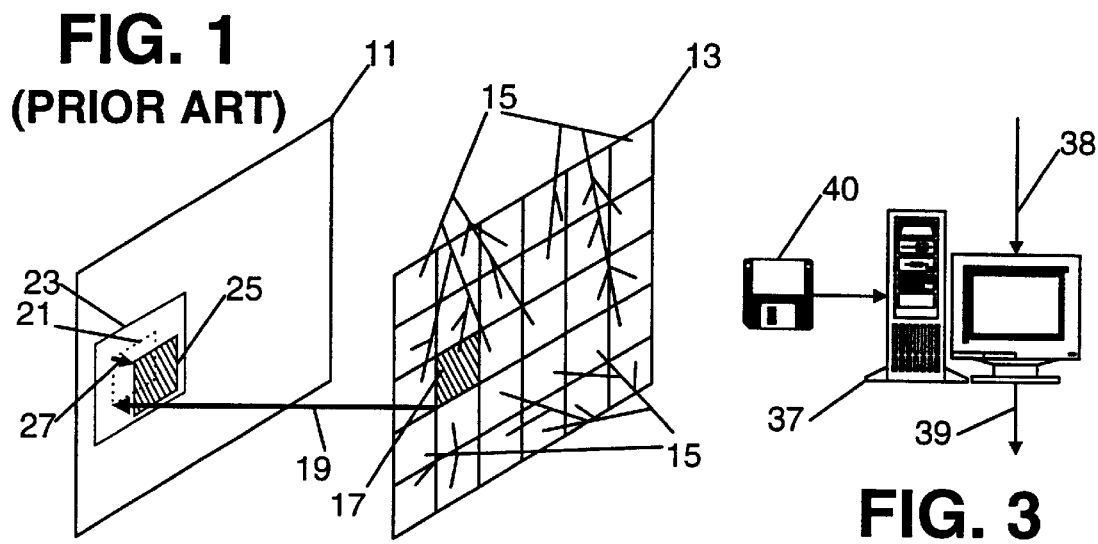
FIG. 1 (PRIOR ART)
FIG. 3
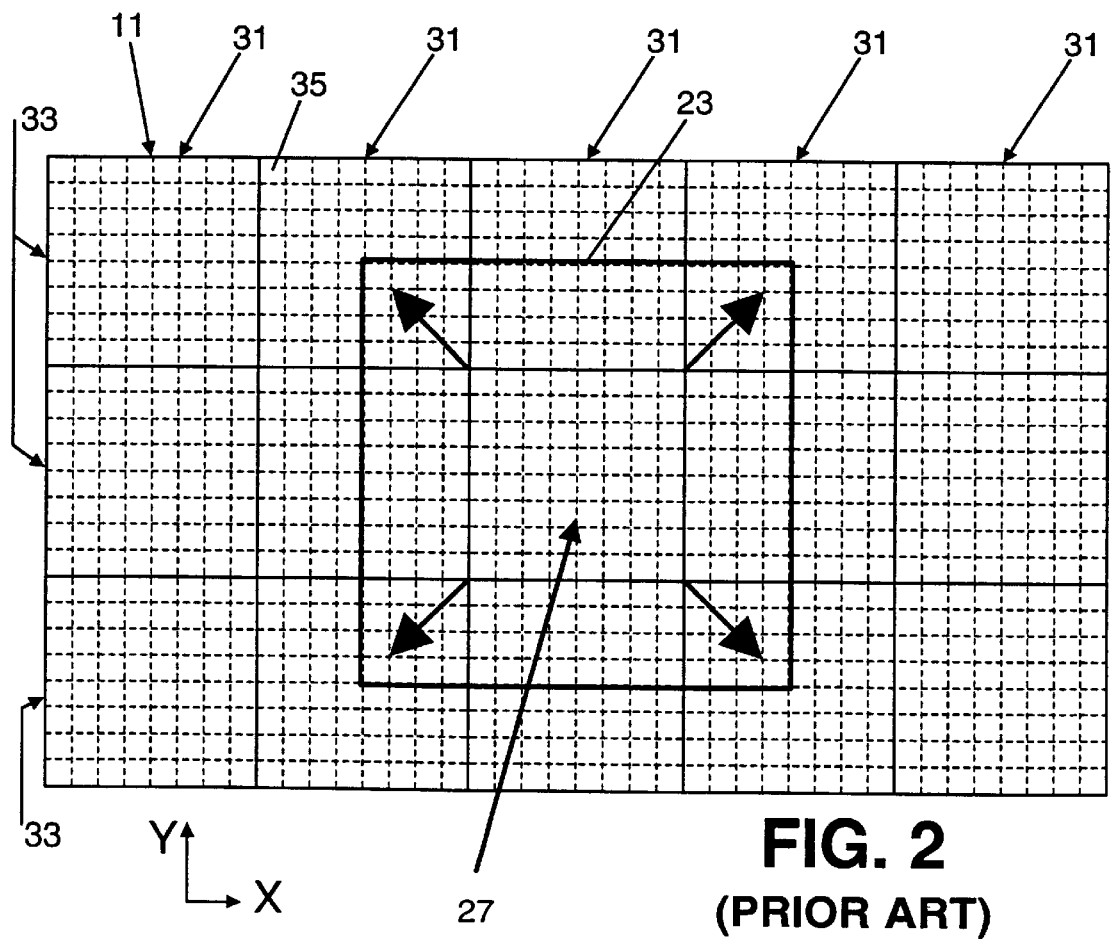
FIG. 2 (PRIOR ART)

SEARCH SYSTEM FOR USE IN COMPRESSION

CROSS REFERENCE TO RELATED APPLICATION

This is a continuation of application Ser. No. 09/191,727 filed on Nov. 12, 1998 now U.S. Pat. No. 6,081,209.

The present invention relates to digital processing and compression. More particularly, the present invention provides an object-based or block-based search system that takes shortcuts in motion compensation using compression information for neighbor data blocks if pixel difference values for those data blocks indicate the compression information to be reliable.

BACKGROUND

Compression of a digital signal reduces the bandwidth needed for signal storage or transmission. For example, a high definition television ("HDTV") signal can require as much as 1 billion bits per second. By reducing the amount of data by as much as a factor of fifty (e.g., to 20 million bits), present day compression techniques facilitate compact storage and real-time transmission of complex signals. Today, compression techniques are commonly applied to transmit video signals through satellite transmission and cable, and they enable storage of video on compact disk or in computer memory.

Well known compression techniques include "JPEG," "MPEG," "MPEG-2," "MPEG-4," "H.261," and "H.263." A primary goal of most of these compression techniques is to take an input stream of full length video or audio, determine redundancies that exist in the signal, and encode those redundancies such that the input signal is compressed to be shorter in length. Compression can be used to eliminate spatial and temporal redundancies; as examples, pixel values in a region of an image frame may be converted into information indicating that the region can be reproduced based upon another part of the same image frame or of a previous image frame, respectively.

Compression algorithms generally rely on block-based (e.g., tile-based or object-based) encoding, which is introduced with reference to FIG. 1. FIG. 1 shows two image frames 11 and 13. The second of these image frames 13, is divided into a number of square tiles 15, and it is desired to compress the second frame so that relatively less data is used for image representation. In typical image compression, pixels for each tile 15 will be separately compressed to remove either spatial redundancies within the same frame (the second frame 13) or temporal redundancies between frames (e.g., by comparison to the first frame 11). In this example, it is to be assumed that the second frame will be compressed only to remove temporal redundancies between frames, but similar principles can be applied to reduce spatial redundancies within the same frame.

To this effect, a digital processing device compares pixels in each tile in the second frame with image pixels found near the same tile location 21 within the first image frame 11. This comparison is indicated by a reference tile 17 and an arrow 19 which points to the same tile location 21 in the first image frame. The digital processing device compares pixels from the reference tile 17 with pixel subsets of a fixed "search window" 23 to determine a "closest match." The "closest match" in FIG. 1 is indicated by a bold square 25, which is illustrated as slightly offset from position of the tile 21. With the "closest match" having been found, the digital processing device calculates a motion vector 27 and a set of pixel value differences called "residuals." The "search window" for each tile defines a maximum set of boundaries beyond which searching will not be performed for the "closest match."

FIG. 2 is used to illustrate searching according to this criteria. In particular, a portion of the first image frame 11 from FIG. 1 is observed as including many pixels, exemplified by the reference numeral 35. A "pixel" is the smallest element of a picture consisting only of a single color and intensity. Although an image frame will consist of hundreds of tiles in both of X and Y directions, FIG. 2 shows five columns 31 and three rows 33 of tiles, where each tile is illustrated to have eight rows and eight columns of pixels. Searching for the "closest match" of a data block, such as the block represented by the numeral 17 in FIG. 1, can be conventionally performed within a fixed search window 23 about an expected location 21 of the closest match. Each square subset of 64 contiguous pixels is sequentially compared to the data block (seen in FIG. 1 and designated by the reference numeral 17) and the "closest match" is the particular subset which differs least from the data block. A motion vector identifies the location of the "closest match" with respect to the expected location, and the associated residuals contain pixel by pixel differences also arranged in a square tile.

The motion vector and residuals are then encoded in a compact manner, usually through "run-length coding," "quantization" and "Huffman coding." The digital processing device repeats this process for each tile 15 until the entire second image frame 13 is compressed. During later decompression, for example, at a network, television station, editing facility, or at an end-viewer's computer or television, the second frame is completely recalculated from an already-decompressed first frame by reconstructing each tile using motion vectors and residuals. The various standards mentioned above generally operate in this manner, although some new standards call for subdividing images into variable size objects instead of tiles (the principles are, however, similar).

The known search methods work well for their intended purposes, but can be quite time intensive. For example, as much as seventy percent (70%) of resources used by a digital processing device to compress an image is applied to searching for the "closest matches" and associated motion vectors. Practically speaking, it is extremely difficult to compress image sequences in real-time. Taking the HDTV example indicated above, compressing many millions of bits per second is difficult even for today's multi-megahertz computers.

Some solutions have attempted to cut down on a full search within a search window. For example, one proposal calls for sampling the search window, e.g., comparison is made using subsets of data incremented by four pixel columns or four pixel rows each iteration in order to find the closest match. Another proposal calls for sampling the fixed size search window in order to guess the approximate location of the "closest match" and then to focus search upon that approximate location. In this latter proposal, three search points within the window are selected and comparisons using these points are made with the tile under consideration; the point yielding the smallest residuals is used to pick three new points, and after several iterations the "closest match" is selected. While generally useful in reducing the amount of searching required, these solutions potentially still require extensive searching within a potentially large search window.

A need exists for a system that can more quickly compress digital signals, particularly video signals. Ideally, such a system would operate in a manner compatible with existing object-based and block-based standards. Further still, such a system ideally should be implemented in software, so as to improve the speed at which existing machines process video and facilitate applications of real-time compression. The present invention satisfies these needs and provides further, related advantages.

SUMMARY OF THE INVENTION

The present invention provides a block-based (e.g., tile-based or object-based) search system that saves substantial time in determining a "closest match." By reducing search window size in dependence upon motion vectors for at least one neighbor block (e.g., tiles, objects, or other data sets) the present invention provides an efficient way of searching when the "closest match" can reliably be expected to be in a particular location. Because the present invention can be embodied as software, firmware or hardware (such as a specialized digital signal processing chip), the present invention provides a relatively inexpensive solution for faster compression. This faster compression, in turn, facilitates real-time compression such as might be used by a television network, cable, or video conference provider. The present invention has application both to high power video processing machines used by these entities, as well as to personal computers and other end-user items.

One form of the present invention provides an improvement in a compression system that compresses data groups in a dependent image frame. This improvement calls for calculating a measure of pixel differences for an already motion compensated data group and comparing that measure to a threshold. If the threshold bears a predetermined relation to the measure of pixel differences, the improvement calls for using a shortcut for motion compensating a current data group, and a default motion compensation strategy is otherwise applied.

In more detailed features of the invention, the improvement may call for the use of a search window which is selected to be alternatively one of a relatively larger size search window or a relatively smaller size search window, the latter being based upon the motion vector for at least one neighbor data block. In more particular aspects of the invention, pixel differences for each of four neighbor data blocks are summed and compared to a threshold. If the sum of the absolute value of pixel differences (for each of the four neighbor blocks) is less than the threshold, then it is presumed that the motion vector for all four neighbor blocks are also good estimates for the motion vector of the block under consideration. Alternatively, if the sum of pixel differences for any neighbor block exceeds the threshold, then it is presumed that the motion vectors for the neighbor data blocks are not a good estimate for the block under consideration, and a relatively larger size search window is instead employed.

In more particular features of the invention, use of alternative search windows of different size can be combined with other, known searching algorithms, e.g., calculation of the closest match using sampling of the relatively smaller size search window, or using a three point, iterative approach.

A second form of the invention relates to an apparatus consisting of instructions stored on machine readable media (e.g., software or firmware) causing performance of the tasks identified above. A third form of the invention relates to an improvement in image processing systems that operates according to the tasks identified above.

The invention may be better understood by referring to the following detailed description, which should be read in conjunction with the accompanying drawings. The detailed description of a particular preferred embodiment, set out below to enable one to build and use one particular implementation of the invention, is not intended to limit the enumerated claims, but to serve as a particular example thereof.

BRIEF DESCRIPTION OF THE DRAWINGS

FIG. 1 illustrates conventional block-based searching used by many of today's compression techniques. In particular, FIG. 1 shows a first frame and a second, subsequent frame which has been divided in tiles of 8×8 or 16×16 pixels.

FIG. 2 illustrates a close-up view of part of the first frame 11 from FIG. 1, in which the tiles are each seen to consists of eight rows and eight columns of pixels. In particular, FIG. 2 is used to help illustrate search for a "closest match" occurring within a fixed search window 23. The search window is seen as centered about the normal position of the tile under consideration, although such does not always have to be the case. The search window could instead be moved in X or Y directions to be centered about an expected position of the "closest match."

FIG. 3 illustrates the preferred embodiment, including an input video stream, an output video stream, and a digital signal processing computer that processes the input video stream as directed by machine readable instructions.

In FIG. 4, "northwest," "north," "northeast" and "west" neighbor tiles of a second, subsequent image frame are respectively labeled "A," "B," "C" and "D," and each neighbor tile further has hypothetical motion vectors 51, 53, 55 and 57 which have been determined by prior processing. The expected "closest match" location for a tile under consideration is labeled by the numeral 45.

FIG. 5 illustrates two possible embodiments, including an alternative embodiment where the relatively smaller size search window is a polygon 61 exactly defined by all of the motion vectors for the neighbor tiles of FIG. 4 and the preferred embodiment where the search window 63 is based on the polygon 61 and additionally enlarged by one pixel in each X direction and each Y direction.

FIG. 6 also shows a full size search window 75 and two relatively smaller size search windows, one of which is a polygon 74 exactly defined by three of the four motion vectors from FIG. 4.

DETAILED DESCRIPTION

Figure 4:
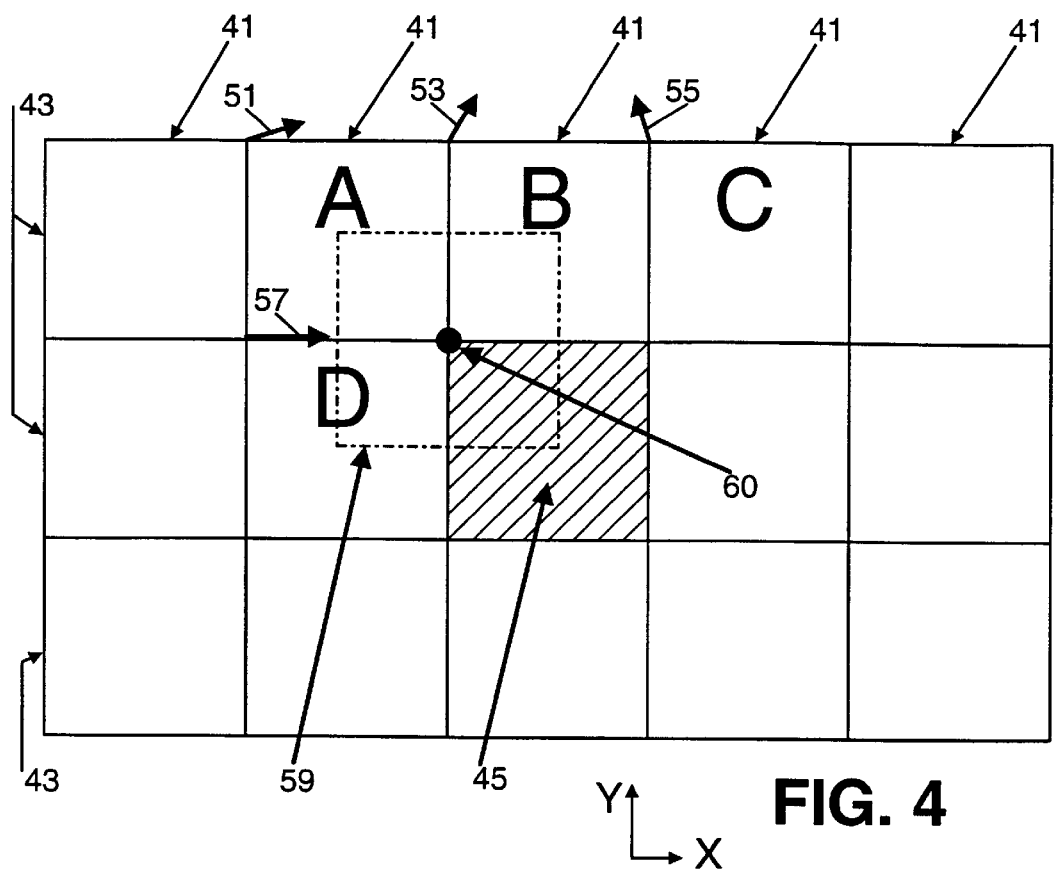
FIG. 4 illustrates searching according to the preferred embodiment.

The invention summarized above and defined by the enumerated claims may be better understood by referring to the following detailed description, which should be read in conjunction with the accompanying drawings. This detailed description of a particular preferred embodiment, set out below to enable one to build and use one particular implementation of the invention, is not intended to limit the enumerated claims, but to serve as a particular example thereof. The particular example set out below is the preferred specific implementation of a video compression software intended for use on a digital signal processing computer or a specialized video compression device (such as used by post-production facilities, television networks and the like). The invention, however, may also be applied to other types of systems as well.

I. Application to MPEG-2

One group of standards currently popular for compression of image sequences has been defined by the Moving Picture Experts' Group, generally referred to as "MPEG." The MPEG standards generally call for compression of individual images into three different types of compressed image frames: compressed independent ("I") frames exploit only image domain redundancies, and contain all the information necessary to reconstruct a single frame; compressed prediction ("P") frames exploit temporal redundancies from a prior frame (either a prior P or I frame) and typically only require only about ⅓ as much data as an I frame for complete frame reconstruction; and, compressed bidirectional ("B") frames can use data from either or both of prior and future frames (P or I frames) to provide frame reconstruction, and may only require ¼ as much data as a P frame. Most MPEG standards (e.g., MPEG-1 and MPEG-2) call for dividing frames into square tiles which contain either 64 or 256 pixels each, although the newer MPEG-4 standard calls for different block geometry, e.g., objects of variable size and shape.

The preferred embodiment operates on the MPEG-2 standard and compresses P frames and B frames, respectively, based upon the comparison of each tile in a P or B frame with a reference image. In the case of P frames, one prior reference image frame is used for encoding. Each tile of the P frame is encoded to have a motion vector and 8×8 block of residuals, which describe how that tile can be very closely reconstructed from the closest match. The compression of B frames is similar, except that two reference image frames are used for encoding, one prior and one subsequent, with a closest match from each reference frame being used for reconstruction of the B frame. Searching for the closest match is conventionally performed only in a limited area, within a search window which is about four times data tile size. That is to say, it is conventional in the case of 64 pixel tiles (eight columns and eight rows) to perform searching for the closest match within a window consisting of sixteen columns and sixteen rows; in the case of 256 pixel tiles (sixteen columns and sixteen rows), searching is conventionally limited to a window having thirty-two columns and thirty-two rows.

During the searching process, each tile of a P or B frame to be compressed will be placed into a motion vector and residual representation, where the residuals are pixel differences between the particular tile and its closest match. A frame which has been represented in this manner is said to be "partially compressed." In typical MPEG implementation, a direct cosine transform ("DCT") is then taken across both rows and columns of residuals for each partially compressed tile to produce a DCT tile. Via a process known as "quantization," the values of the DCT tile are rounded to set some of the insignificant terms to zero. Via "run-length coding," the terms of the DCT tile are ordered diagonally from upper left to bottom right, with the insignificant terms (which have now been rounded to zero) being ordered last; these insignificant terms are replaced by an escape character indicating that the rest of the matrix is zero. Finally, a process known as "Huffman coding" is also applied to represent all possible terms of the DCT tile by the smallest number of bits possible. These processes applied to an image sequence generally result in the sequence being "fully compressed" and ready for storage or transmission as an output signal of the system.

Of the "full" compression process, searching for the closest match for each tile (to thereby produce a partially compressed frame) can require as much as seventy (70%) of the entire compression process.

II. The Principal Parts

In accordance with the principles of the present invention, the preferred embodiment performs standard MPEG-2 compression as has been just described, but takes certain shortcuts in the search for the closest match to substantially reduce the overall requirement for compression time or resources. In particular, the preferred embodiment performs searching using at least two alternative search windows. As seen in FIG. 3, the preferred embodiment includes image processing software or firmware that causes a digital processing device 37 (such as a computer) to compress an input signal 38 and derive a compressed output signal 39. The image processing software or firmware is stored on machine readable media 40, which can be a computer hard disk, floppy disk, or other type of electrical, optical or magnetic storage.

The preferred embodiment uses a conventional (large size) search window as one of its alternative search windows. It also includes software which attempts to limit search window size dramatically if possible. To this effect, the preferred embodiment looks to at least one neighbor tile which has already been placed into motion vector and residual format and decides whether that motion vector is a good estimate of motion for the present tile as well. The second search window is positioned and sized based on this motion vector, while the choice between the first, relatively larger size search window, and second, relatively limited search window, is made based on whether the motion vector is or is not a good estimate. This determination in turn is made by looking at whether residuals for the neighbor tile are in general large (poor match) or small (good match). The preferred embodiment, in fact, looks at not one but at all four previously compressed neighbor tiles to make these determinations, as will be explained with reference to FIG. 4.

FIG. 4 shows a close-up of one image frame which is to be compressed; this image frame could be the second frame, 13, from FIG. 1. As with the MPEG-2 standard, the frame has been divided into square tiles organized into columns 41 and rows 43 (though it would also be possible to use an object-based approach such as pursuant to the MPEG-4 standard). Compression software, as is conventional, proceeds to partially compress each row of tiles from left to right of the image frame, proceeding to the next lower row after finishing an entire row. For purposes of explaining the operation of the preferred embodiment, it should be assumed that data from a particular tile 45 is to now be compressed, while tiles within the same row to the left (such as tile "D") and all tiles above the particular tile 45 (such as tiles "A," "B" and "C") have already been partially compressed.

The preferred embodiment looks at all four neighbor tiles which have been partially compressed, e.g., tiles A, B, C and D (which are also respectively referred to as "northwest," "north," "northeast" and "west" tiles). Each of these tiles has an illustrative motion vector 51, 53, 55 and 57, which is drawn from the upper left corner of the tile to indicate the relative direction of the closest match from a reference image frame. The goal of searching is to also find a motion vector with reference to the upper left corner 60 of the particular tile 45. Conventionally, systems using the MPEG-2 standard would compare the pixel values from the particular tile 45 with each square having an upper left corner found within the dotted line 59 illustrated in FIG. 4. That is to say, exhaustive searching within a full search window would result in motion search within the window 23 discussed earlier in connection with FIG. 2.

According to the principles of the present invention, the preferred embodiment looks at the residuals for each of tiles A, B, C and D; since these residuals can be positive or negative, their absolute value is taken and (for each 64 pixel tile) are all summed together to yield a number. This number is compared to a threshold, e.g., the value 128. If the number does not exceed this threshold, then the motion vector for the tile A, B, C or D is presumed to be a good estimate of motion. The preferred embodiment performs this inquiry for all four tiles A, B, C and D to ensure that partial compression for the neighbor tiles consistently produced good estimates of motion. If this condition is satisfied, a second, relatively smaller size search window is selected. This second window is preferably sized to encompass all motion vectors for the neighbor tiles, increased by one in each of positive and negative X and Y directions.

Figure 5:
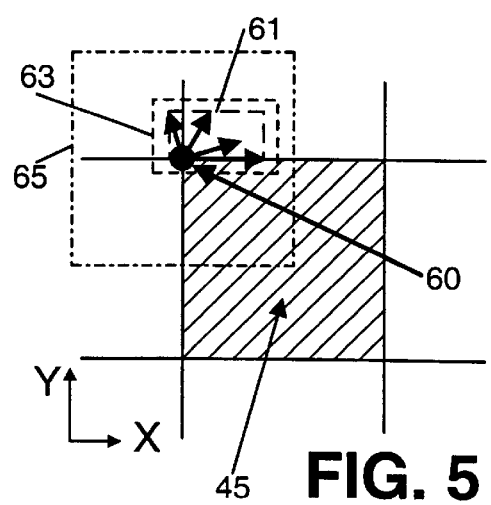
FIG. 5 further illustrates fixed (relatively larger) and variable (relatively smaller) size search windows according to the preferred embodiment; these search windows are drawn about the upper left-hand corner 60 of the tile under consideration 45. In particular, the search window is set to be either a full size search window 65 or a relatively smaller, variable size search window 63 based upon the motion vectors from FIG. 4.

This operation is illustrated with respect to FIG. 5. In particular, FIG. 5 shows the expected position 45 of the closest match, the upper left corner 60 of this expected position, and the four motion vectors for tiles A, B, C and D which have been superimposed upon the upper left corner 60. FIG. 5 also shows two alternative search windows, including a relatively larger size search window 65 and a relatively smaller size search window 63. The preferred embodiment selects one of these alternative windows based on all four tiles A, B, C and D. If it is assumed that all four tiles A, B, C and D from FIG. 4 have associated numbers ("R") that do not exceed a threshold, e.g., the value 128, then the relatively smaller size search window 63 is used.

Preferably, the relatively smaller size search window is sized using all four motion vectors for the neighbor tiles to define a rectangular region 61. This region is then increased by one in each of positive and negative x directions, and positive and negative Y directions, to thereby yield the search window 63. On the other hand, if the threshold is smaller than the number R for any neighbor tile A, B, C or D, then the larger (full size) search window 65 is used. Importantly, the threshold can be made static for a system, or it could be made to be adaptive such that it varies from frame to frame.

Figure 6:
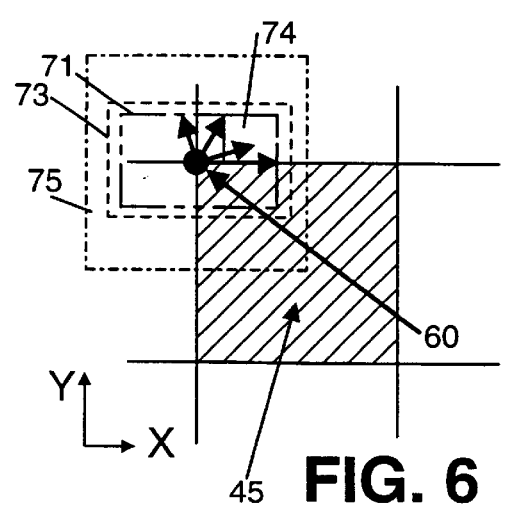
FIG. 6 illustrates an alternative to the search window strategy of FIG. 5, where a search window can be centered about the upper left corner 60 of the expected position of the tile under consideration 45.

To illustrate the potential savings achieved using alternative search windows, it is assumed for the example seen in FIGS. 4–6 that the motion vectors for the neighbor tiles are (2,1), (1,2), (−1,2), and (3,0) respectively. In this case, the relatively smaller size search window would have coordinates of (−2,3), (4,−1), (−2,−1) and (4,3), and would imply at most 35 comparisons. With 64 pixel tile sizes, exhaustive searching within this smaller window would take about 55% as much time as exhaustive searching using a conventional window; with tile sizes of 256 pixels, exhaustive searching within this smaller window would take about 13% as much time.

Notably also, sizing of a relatively smaller size search window varies from tile to tile under analysis, and shape of the search window can frequently be rectangular. This operation differs from most conventional search strategies, which require search be limited to a square search window.

Several contemplated alternative embodiments use different sizing strategies and are illustrated with respect to FIG. 6. In one strategy, the motion vectors for all four tiles are mirrored about X and Y axes which pass through the upper left corner 60, to define a rectangular region 71. This region may then be increased by one in each dimension, as indicated by the window 73. Alternatively, a "majority rule" strategy could be used to size a very small window; with this strategy, less than all four neighbor tiles could be used. For example, if the number R for one neighbor tile exceeded the threshold, then the system could use less than all four tiles, e.g., a minimum of three. In a different example, if all four neighbor tiles are used, the system could discard the most dissimilar motion vector from among them and choose a window 74 based on a subset of neighbor tiles, motion vectors. Using the exemplary motion vector values mentioned above, this latter example would feature a search window of (3,2), (3,0), (1,2) and (1,0), and would imply only 9 comparisons. As with the preferred embodiment, a relatively larger size search window 75 would be used based on a comparison of at least one neighbor tile with predetermined criteria. In still another alternative embodiment, a non-square, non-rectangular polygon (e.g., a parallelogram) can be used as the relatively smaller size search window.

Figure 7:
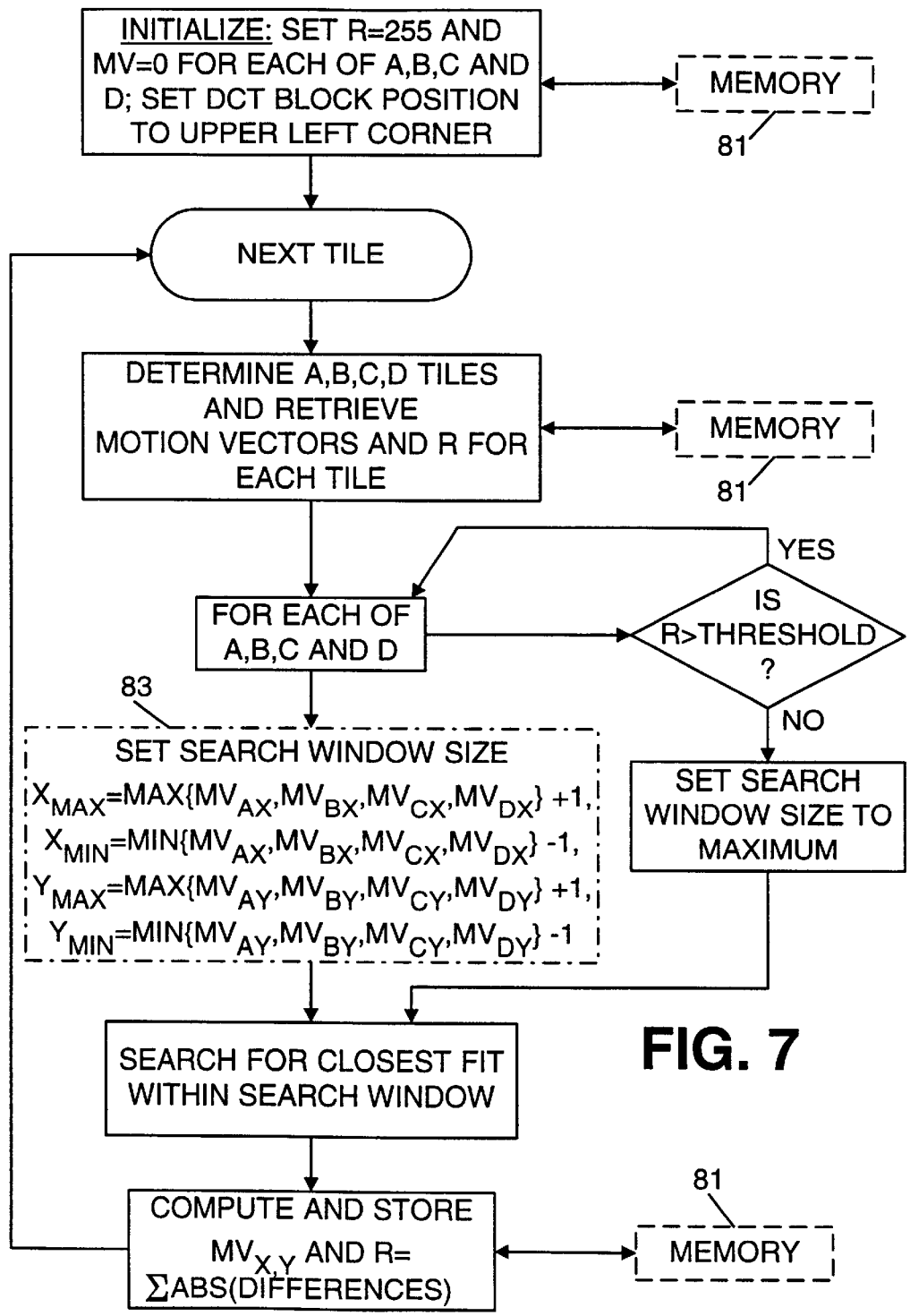
FIG. 7 is a software block diagram indicating tile-based search used by the preferred embodiment.

The software generally performs the processes in the manner identified in FIG. 7. When analyzing a new frame, the software begins with the upper left most tile and works row by row, proceeding toward the bottom of the frame. As the software processes each tile to derive a motion vector and set of residuals, it calculates the number "R," and stores the motion vector and R in a table arranged by rows of the present frame (plus one), and columns for the present frame (plus one). For example, if a particular image frame included 200 rows of tiles and 300 columns of tiles, the entries into the table would be for 201 rows and 301 columns, respectively. The extra row and column are used to define neighbor tile values for the top-most row and left-most column, respectively.

As it begins processing each new frame, the software initializes memory 81 and loads each entry of the table with R equal to $R_{max}$ (e.g., 255) and a default motion vector (e.g., 0,0). The software then proceeds to analyze the upper left most tile and, subsequently, the top row of tiles by comparing them to reference image data. For the top row and the left column of tiles, the preferred search strategy discussed above in connection with FIG. 4 will result in search using the relatively larger size search window. Alternatively, if a three-of-four neighbor tile system is used as also mentioned above, then only the top row of tiles would necessarily use the larger size search window.

As each tile is processed, the software determines the location of neighbor tiles A, B, C and D, and retrieves their associated motion vectors and numbers R from the memory 81. If the number R for any one or more tiles exceeds the threshold, then the search window size is set to maximum, e.g., +8,−7 for 64 pixel tiles in each of X and Y directions from the expected location of the closest match. Alternatively, if the threshold is larger than R for all four tiles, the software calculates the size of the relatively smaller size search window and chooses it for the tile under consideration, as represented by the numeral 83 in FIG. 7. Any alternative search window sizing strategies discussed above may also be substituted at this point.

The software then performs motion search using the selected search window to find the closest match and compute the associated motion vector and residuals. The software also computes the number R for the particular tile based on these residuals and stores both the motion vector and R in the table for the particular frame (in the memory 81), and proceeds to the next tile.

Importantly, those having skill in video processing will readily perceive that there are many possible variations to the preferred embodiment just described. For example, the principles of the present invention could be applied to different compression standards, such as MPEG-1, JPEG, H.261, H.263, and other standards as well. It further is not necessary to the operation of the invention to have square "tiles," and variable size data blocks can also be manipulated using the teachings of the present invention. For example, the MPEG-4 standard calls for use of data blocks which represent objects rather than the fixed tiling structure called for by MPEG-2. Alternatively, while the preferred embodiment is software which can be run on a computer, one could also implement the present invention in firmware, in a specialized computer chip ("hardware") of via some other device. One could also implement a system that uses three or more alternative search windows, or a system that compresses only spatial redundancies (e.g., the reference image data is taken from the same image frame). The teachings herein may be applied to all of these standards and devices as well as other devices and standards without departing from the scope of the present invention.

Significantly also, the present invention may be combined with other searching methods. For example, the present invention calls for providing a relatively smaller size search window that defines maximum boundaries for search; the prior solutions of sampling a search window or using a subset of points to "focus-in" on a portion of the search window are not inconsistent with the use of alternative search windows.

Having thus described several exemplary implementations of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. In a compression system that compresses data groups in a dependent image frame such that each data group can be reconstructed from other data from an anchor frame based on a motion vector and a pixel difference representation, an improvement comprising:

in compressing a current data group, if motion vector and pixel difference data is available for already-motion-compensated neighbor data groups, then for at least one neighbor data group, calculating a measure of pixel differences and comparing that measure to a threshold;

in response to the comparison, employing a shortcut for motion compensating the current data group based upon compression information for at least one already-compensated neighbor data group if the threshold bears a predetermined relation to the measure of pixel differences; and employing a default motion compensation strategy for the current data group if threshold does not bear the predetermined relation to the measure of pixel differences.

2. An improvement according to claim 1, wherein each image is divided into square tiles of data, the improvement further comprising using one of the tiles as each neighbor data group.

3. An improvement according to claim 1, wherein:

the default motion compensation strategy includes exhaustively searching a search window within the anchor frame for a candidate closest match; and the shortcut includes foreclosing at least portions of the search window without search.

4. An improvement according to claim 3, wherein the shortcut further includes calculating a limited size search window in dependence upon each motion vector for already-motion-compensated neighbor data groups where the corresponding measure of pixel differences bears a predetermined relation to the threshold.

5. An improvement according to claim 1, wherein each image is divided into square tiles of data, the improvement further comprising:

in compressing a current tile, if motion vector and pixel difference data is available for already-motion-compensated neighbor tiles, then for each such already-motion-compensated neighbor tile, calculating a measure of pixel differences and comparing that measure to a threshold;

in response to the comparison, employing a shortcut for motion compensating the current tile if, for each available already-motion-compensated neighbor tile, a threshold meets a predetermined relation to the measure of pixel differences; and employing a default motion compensation strategy for the current tile if the threshold does not meet the predetermined relation for any already-motion-compensated neighbor tile.

6. An improvement according to claim 1, wherein:

the measure is dependent upon the sum of absolute values of each pixel difference for the data group;

the threshold corresponds to a number of maximum pixel differences, beyond which it is presumed that a motion vector for the corresponding neighbor data group is a poor estimate of motion; and the predetermined relation is that the threshold is larger than the measure, such that a shortcut is taken if a neighboring motion vector provides a good estimate of motion.

7. An improvement according to claim 6, wherein residual data for each one of four neighbor tiles is compared to the threshold, and a shortcut is taken in dependence upon each motion vector for neighbor tiles where the corresponding residual data bears a predetermined relation with respect to a threshold.

* * * * *